(12) United States Patent
Sutardja

(10) Patent No.: US 6,732,286 B1
(45) Date of Patent: May 4, 2004

(54) HIGH LATENCY TIMING CIRCUIT

(75) Inventor: Pantas Sutardja, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 618 days.

(21) Appl. No.: 09/725,818

(22) Filed: Nov. 30, 2000

(51) Int. Cl.[7] .............................................. G06F 1/12
(52) U.S. Cl. ..................................... 713/400; 375/376
(58) Field of Search ............................. 713/400, 401, 713/500, 503

(56) References Cited

U.S. PATENT DOCUMENTS

| | | | |
|---|---|---|---|
| 4,712,223 A | * 12/1987 | Nelson | 377/43 |
| 5,093,847 A | * 3/1992 | Cheng | 375/97 |
| 5,150,082 A | * 9/1992 | Grimmett et al. | 332/128 |
| 5,436,937 A | * 7/1995 | Brown et al. | 375/376 |
| 5,546,433 A | * 8/1996 | Tran et al. | 375/376 |
| 5,703,539 A | 12/1997 | Gillig et al. | |
| 5,727,038 A | 3/1998 | May et al. | |
| 5,745,011 A | 4/1998 | Scott | |
| 5,754,607 A | 5/1998 | Powell et al. | |
| 5,761,258 A | 6/1998 | Lee | |
| 5,793,824 A | 8/1998 | Burch et al. | |
| 5,874,863 A | 2/1999 | Wojewoda et al. | |
| 5,889,829 A | 3/1999 | Chiao et al. | |
| 5,889,863 A | 3/1999 | Weber | |
| 5,986,513 A | 11/1999 | Nepple et al. | |
| 5,987,085 A | 11/1999 | Anderson | |
| 6,028,727 A | 2/2000 | Vishakhadatta et al. | |
| 6,066,988 A | 5/2000 | Igura | |
| 6,084,480 A | 7/2000 | Uneme | |
| 6,134,276 A | * 10/2000 | Aman et al. | 375/326 |
| 6,650,719 B1 | * 11/2003 | Baker | 375/371 |

* cited by examiner

Primary Examiner—Thomas M. Heckler

(57) ABSTRACT

A phase locked loop circuit, including a digital filter loop for timing recovery, includes a phase synchronization feedback loop, a frequency synchronization feedback loop, and a phase shift measurement circuit. The phase shift measurement circuit includes a shift register. Timing recovery takes place by first operating the circuit in an acquisition mode, then operating the circuit in a tracking mode. During the acquisition mode, an input to the frequency synchronization feedback loop is set to zero, and the phase synchronization feedback loop is operable at a high bandwidth rate to synchronize phase and to compute a value of frequency offset using the shift register. During the tracking mode, the input to the frequency synchronization feedback loop is set equal to the computed value of frequency offset. Also during the tracking mode, both the frequency synchronization feedback loop and the phase synchronization feedback loop are jointly operable at a low bandwidth rate to synchronize frequency and to track further deviations of phase or frequency. The circuit may also include a phase interpolator and a synthesizer. The synthesizer may generate a control signal, and the phase interpolator may then receive an output signal of the phase synchronization feedback loop and the generated control signal and use the received signals to calculate the frequency offset.

100 Claims, 4 Drawing Sheets

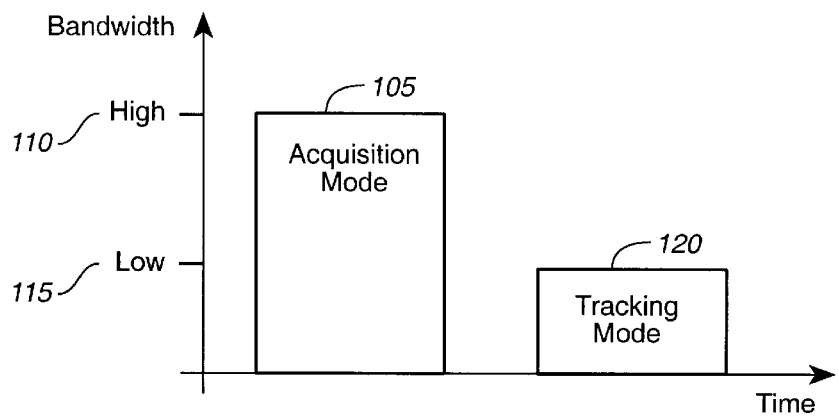
FIG._1
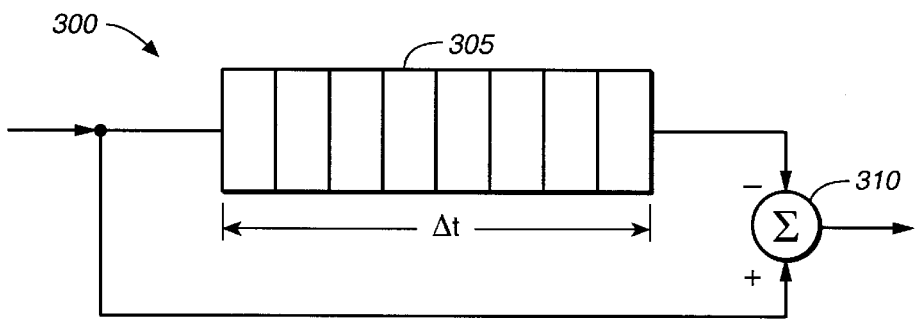
FIG._3
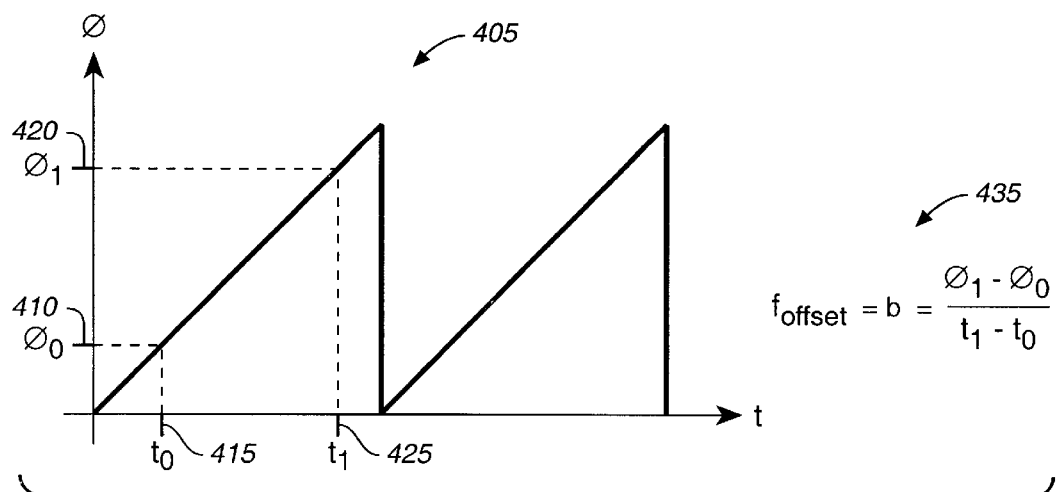
FIG._4

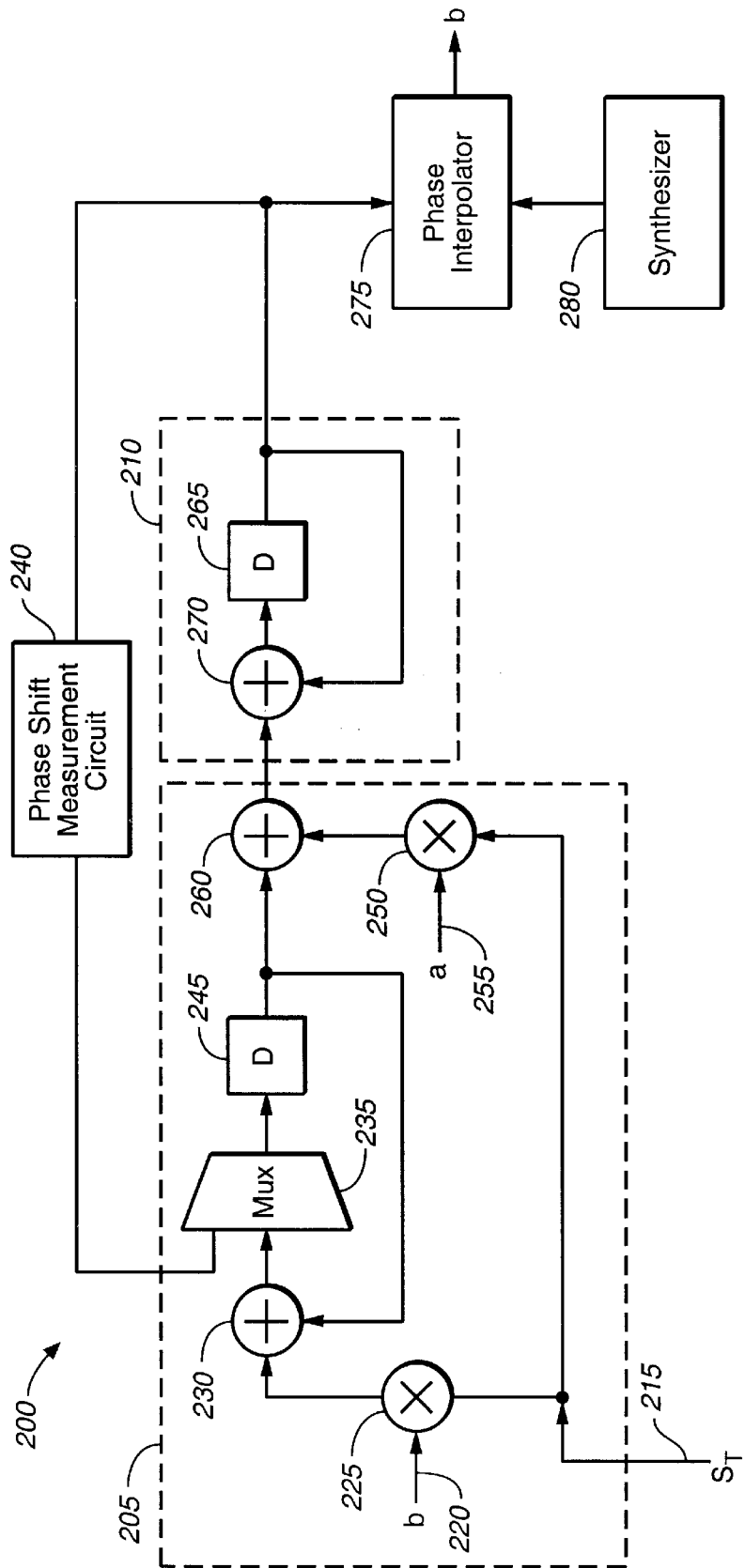
FIG._2

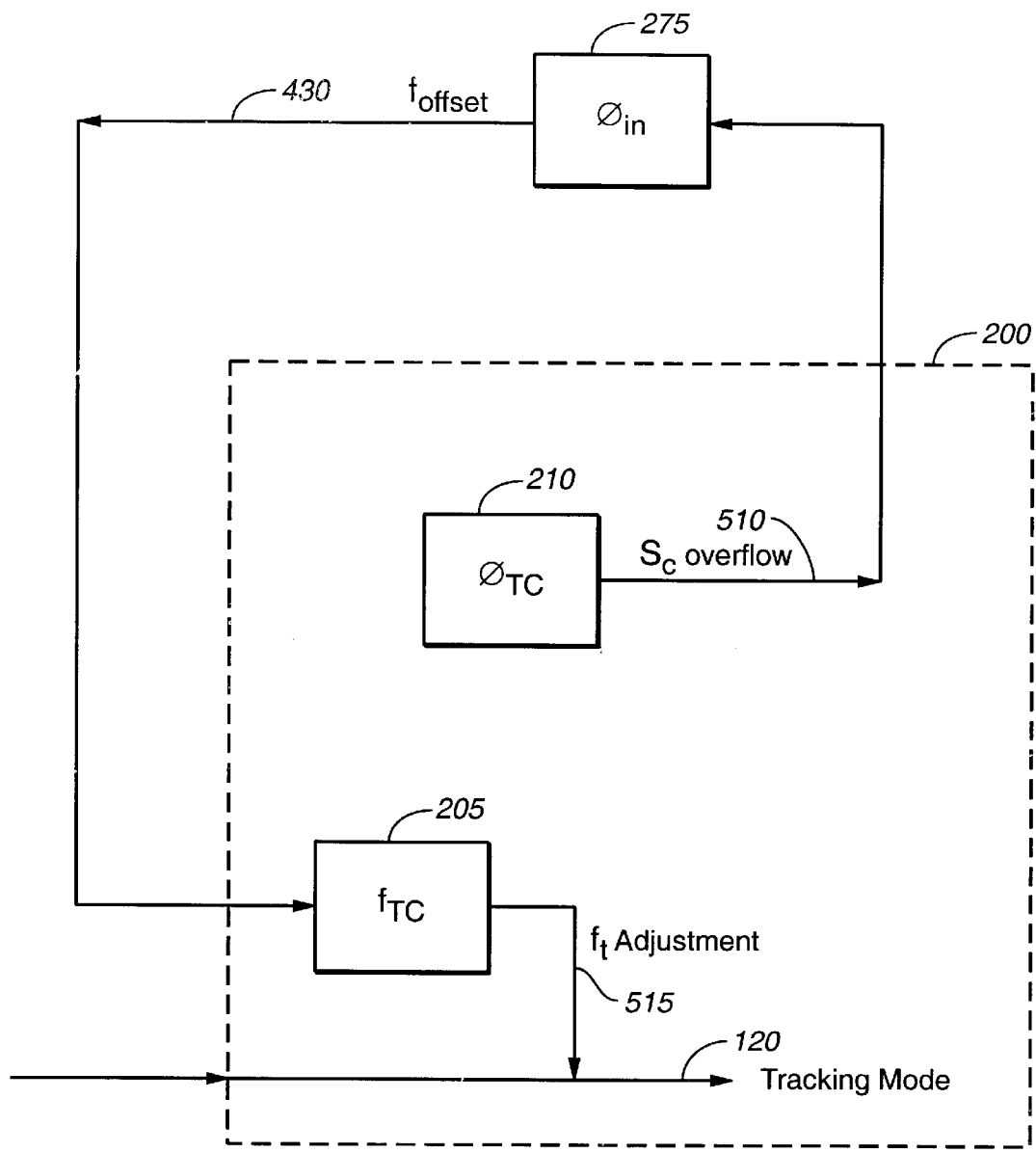
FIG._5

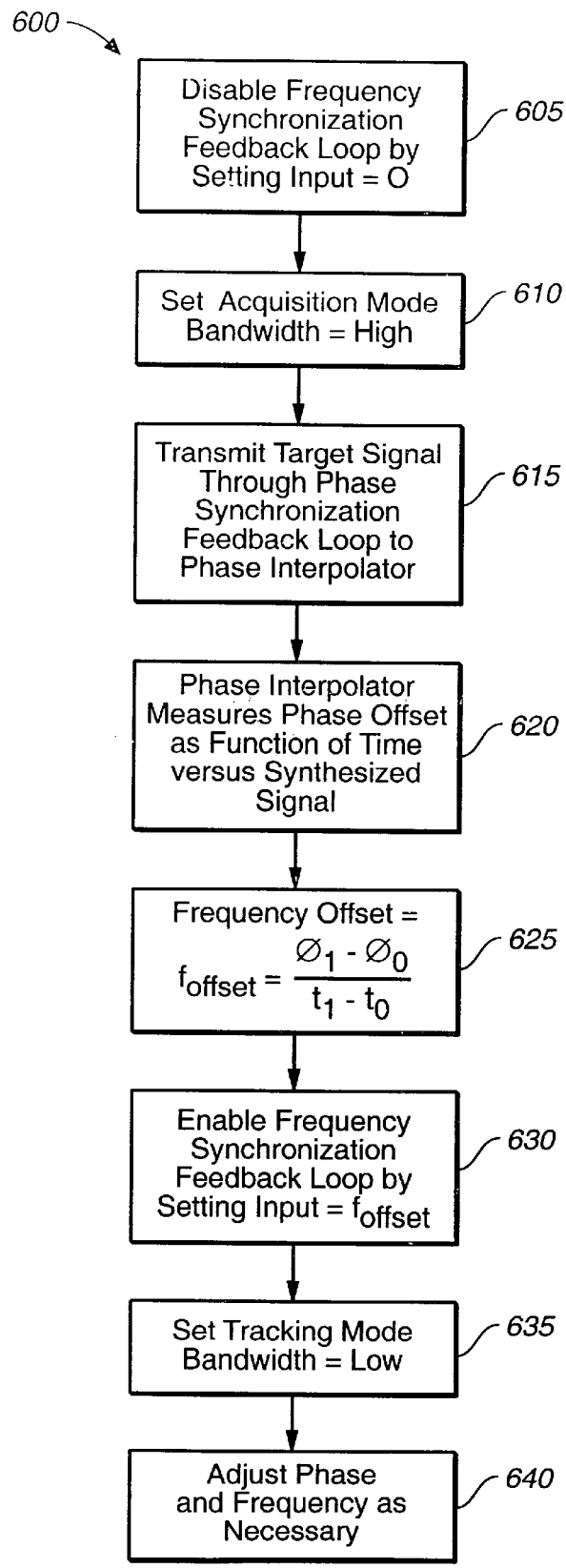
FIG._6

HIGH LATENCY TIMING CIRCUIT

BACKGROUND OF THE INVENTION

1. Field of the Invention

The present invention relates to a timing circuit for synchronization of phase and frequency, and particularly to such a circuit having a highly pipelined structure, thereby optimizing the circuit for use in a high-speed read channel while inducing high latency.

2. Description of the Related Art

A clock and data recovery system, which may be referred to as a channel, invariably requires a timing recovery feedback loop for clock synchronization. Historically, this need has been fulfilled through the use of a phase-locked loop timing circuit. Phase-locked loop timing circuits typically include a frequency integration feedback loop and a phase integration feedback loop. They operate by first ascertaining the timing frequency and timing phase of the target signal, "locking" onto that frequency and phase, and then tracking deviations to both phase and frequency. The process of locking onto the timing frequency and timing phase is generally referred to as the acquisition mode, and the process of tracking deviations is generally referred to as the tracking mode. Phase-locked loop timing circuits are very well known in the literature and are the subject of many patents. For example, see U.S. Pat. Nos. 5,703,539; 5,727,038; 5,745,011; 5,754,607; 5,761,258; 5,793,824; 5,874,863; 5,889,829; 5,986,513; 5,987,085; 6,028,727; 6,066,988; and 6,084,480, the contents of each of which are incorporated herein by reference.

Typically, a frequency integration feedback loop includes a resistor and a capacitor connected in series, with the capacitor also connected to ground; and a phase integration feedback loop includes a voltage-controlled oscillator. The target signal, generally regarded as being an "error" signal because its phase and frequency require adjustment, is provided as input to the frequency integration feedback loop, and the output of that loop is provided as input to the phase integration feedback loop. Hence, the two loops generally operate jointly. However, the joint use of the two feedback loops reduces the stability of the overall circuit, as compared to the stability of each individual feedback loop. The stability of the overall circuit is inversely related to the speed at which the circuit is operated. In other words, if the circuit is operated at a sufficiently low speed, the circuit remains stable, but as the operation speed increases, the circuit tends to become unstable.

If a channel is to operated at a high speed, the feedback loop must be structured in a highly "pipelined" manner; i.e., more feedback elements must be present in the loop. This causes the loop to have a high latency, or time delay, associated with it. A high latency generally causes degraded performance of the timing loop, which in turn requires that the loop bandwidth be reduced in order to maintain loop stability. However, the timing acquisition must be accomplished in as short a time as possible, in order to maintain the speed of the channel and thereby not adversely impact overall system performance. Thus, a dilemma for implementation of high speed channels is presented.

SUMMARY OF THE INVENTION

The present invention is intended to overcome the drawbacks noted above and provides a high speed timing recovery system with reduced latency.

In one aspect, the invention provides a digital phase locked loop (DPLL) circuit. The DPLL circuit includes a digital filter loop including a register, a digital voltage-controlled oscillator (VCO) responsive to the digital filter loop, and a phase shift measurement circuit responsive to the digital VCO. The register selectively receives an output of the phase shift measurement circuit for frequency offset correction. The DPLL circuit may be operable in an acquisition mode at a high bandwidth rate and in a tracking mode at a low bandwidth rate. When the DPLL circuit is operating in the acquisition mode at a high bandwidth rate, an input to the register may be set equal to zero to maintain DPLL circuit stability. The DPLL circuit may also include a phase interpolator and a synthesizer. The synthesizer may be used to generate a control signal. The phase interpolator may be used to receive an output signal of the phase shift measurement circuit and the generated control signal and use the received signals to calculate a frequency offset value.

In another aspect, the invention provides a phase locked loop circuit, including a digital filter loop for timing recovery. The circuit includes a phase synchronization feedback loop, a frequency synchronization feedback loop, and a phase shift measurement circuit. The phase shift measurement circuit includes a shift register. When an input to the frequency synchronization feedback loop is set to zero, the phase synchronization feedback loop is operated at a high bandwidth rate to synchronize phase and to compute a value of frequency offset using the shift register. Once the frequency offset has been computed, the input to the frequency synchronization feedback loop is set to the computed value of frequency offset, and the frequency synchronization feedback loop and the phase synchronization feedback loop are jointly operated at a low bandwidth rate to synchronize frequency and to track further deviations of phase or frequency. The use of a low bandwidth rate ensures circuit stability.

The phase locked loop circuit may also include a phase interpolator and a synthesizer. The synthesizer may generate a control signal. The phase interpolator may then receive an output signal of the voltage-controlled oscillator and the generated control signal, and use the received signals to calculate the frequency offset.

In yet another aspect of the invention, a digital loop filter for use as part of a phase locked loop includes a first integrator for frequency synchronization and a second integrator for phase synchronization. During a first synchronization period, the filter disables the first integrator and uses the second integrator to synchronize phase and calculate a frequency offset value. During a second synchronization period, the filter enables the first integrator and uses the calculated frequency offset value as an input to the first integrator to synchronize frequency. The filter may also include a phase interpolator for calculating the frequency offset value using a residual phase error that remains after phase is synchronized. The phase interpolator calculates the frequency offset value by measuring phase twice, subtracting the first measured value of phase from the second measured value of phase, and dividing the resultant difference by an elapsed time between the two measurements.

In still another aspect, a digital data acquisition loop is used with a phase interpolator. The loop includes a phase timing circuit having an overflow output, including a control signal. The control signal is provided to the phase interpolator, which outputs a frequency offset corresponding to the overflow output. The loop also includes a frequency timing circuit, which receives the frequency offset from the phase interpolator and adjusts the frequency timing of an input data stream based on the received frequency offset. The loop may also initially disable the frequency timing circuit during an acquisition period corresponding to the outputting of the frequency offset, and subsequently enable the frequency timing circuit during a tracking period that follows the outputting of the frequency offset. The loop may operate at a high speed during the acquisition period to ensure high performance, and at a low speed during the tracking period to ensure loop stability.

In a further aspect of the invention, a read channel for a hard disk drive includes a digital phase locked loop (DPLL) circuit. The DPLL circuit includes a digital filter loop comprising a register, a digital voltage-controlled oscillator (VCO) responsive to the digital filter loop, and a phase shift measurement circuit responsive to the digital VCO. The register selectively receives an output of the phase shift measurement circuit for frequency offset correction. The DPLL circuit may be operable in an acquisition mode at a high bandwidth rate and in a tracking mode at a low bandwidth rate. When the DPLL circuit is operating in the acquisition mode at a high bandwidth rate, an input to the register may be set equal to zero to maintain DPLL circuit stability. The DPLL circuit may also include a phase interpolator and a synthesizer. The synthesizer may be used to generate a control signal. The phase interpolator may be configured to receive an output signal of the phase shift measurement circuit and the generated control signal and use the received signals to calculate a frequency offset value.

In yet another aspect of the invention, a read channel for a hard disk drive has a digital filter and includes a first integrator for frequency synchronization, a second integrator for phase synchronization, and a phase interpolator. During a first synchronization period, the filter disables the first integrator, uses the second integrator to synchronize phase and output a residual phase error to the phase interpolator, and uses the phase interpolator to calculate a frequency offset value. During a second synchronization period, the filter enables the first integrator and uses the calculated frequency offset value as an input to the first integrator to synchronize frequency.

In still another aspect of the invention, an integrated circuit, including a digital filter loop for timing recovery, includes a phase shift measurement circuit, a phase synchronization feedback loop, and a frequency synchronization feedback loop. The phase shift measurement circuit includes a shift register. When an input to the frequency synchronization feedback loop is set to zero, the phase synchronization feedback loop runs at a high bandwidth rate to synchronize phase and to compute a value of frequency offset using the shift register. The input to the frequency synchronization feedback loop is then set equal to the computed value of frequency offset. The frequency synchronization feedback loop and the phase synchronization feedback loop then are jointly run at a low bandwidth rate to synchronize frequency and to track further deviations of phase or frequency.

In another aspect of the invention, a phase locked loop circuit includes a timing frequency integrator portion, which includes a first multiplier component, a first adder component, a multiplexer, and a first delay component connected in series. The first delay component provides an output as feedback to the first adder component. The circuit also includes a timing phase integrator portion, which includes a second multiplier component, a second adder component, a third adder component, and a second delay component connected in series. The second delay component provides an output as feedback to the third adder component. The circuit also includes a phase shift measurement portion which provides and output to the multiplexer. The circuit also includes a phase interpolator and a signal generator. The timing frequency integrator portion, the timing phase integrator portion, and the phase interpolator are connected in series. The phase shift measurement portion and the phase interpolator are connected in series. The signal generator generates a control signal and provides the control signal as an input to the phase interpolator. When an input to the timing frequency integrator portion is set to zero, the timing phase integrator portion runs at a high bandwidth rate to synchronize phase and to compute a value of frequency offset using the phase interpolator. When the input to the timing frequency integrator portion is set equal to the computed value of frequency offset, the timing frequency integrator portion and the timing phase integrator portion are jointly run at a low bandwidth rate to synchronize frequency and to track further deviations of phase or frequency. The voltage-controlled oscillator may also include a shift register.

In a further aspect of the invention, an apparatus for synchronizing phase and frequency in a high-speed circuit includes means for synchronizing phase using a first type of feedback loop during a first synchronization period, means for calculating a value of frequency offset using the first type of feedback loop during the first synchronization period, and means for synchronizing frequency using the calculated value of frequency offset as an input to a second type of feedback loop during a second synchronization stage. The first type of feedback loop adjusts phase but not frequency. The second type of feedback loop adjusts both phase and frequency.

In yet another aspect of the invention, a method of synchronizing phase and frequency in a high-speed circuit includes the steps of synchronizing phase using a first type of feedback loop during a first synchronization period; calculating a value of frequency offset using the first type of feedback loop during the first synchronization period; and synchronizing frequency using the calculated value of frequency offset as an input to a second type of feedback loop during a second synchronization stage. The first type of feedback loop adjusts phase but not frequency. The second type of feedback loop adjusts both phase and frequency.

In another aspect of the invention, a method of controlling frequency and phase in a high-speed control circuit includes the steps of executing an acquisition mode in which phase deviation is corrected and frequency deviation is computed, and executing a tracking mode in which frequency deviation is corrected. The acquisition mode operates at a high bandwidth value to cause the high-speed control circuit to operate at a high speed related to the high bandwidth value. The tracking mode operates at a low bandwidth value to maintain stability of the circuit.

In a further aspect of the invention, a method of increasing speed in a timing recovery circuit is manifested. The circuit includes a frequency synchronization portion and a phase synchronization portion, and the circuit has a high latency. The method of increasing speed in the circuit includes the steps of substantially disabling the frequency synchronization portion temporarily by providing an input value of substantially zero; selecting a high value of bandwidth to be used by the phase synchronization portion while the frequency synchronization portion is substantially disabled; synchronizing phase at a speed related to the selected bandwidth value; using a residual phase error, resulting from the fact that the frequency has not been synchronized, to calculate a value of frequency offset; selecting a low value of bandwidth to be used by the circuit while the frequency synchronization portion is not disabled; and enabling the frequency synchronization portion by providing an input value equal to the calculated frequency offset value.

In yet another aspect of the invention, a method of phase and frequency adjusting an input digital data stream includes an acquisition period, during which the steps of integrating a phase of the input data stream until an overflow causes a control signal to be output and determining a frequency offset from the control signal are executed. The method further includes a data acquisition period, during which the step of integrating a frequency of the input data stream using the determined frequency offset is executed.

BRIEF DESCRIPTION OF THE DRAWINGS

FIG. 1 is a graph showing the time and bandwidth attributes of an acquisition mode and a tracking mode that occur during a timing recovery process.

FIG. 2 is a circuit diagram of a phase-locked loop circuit for implementing the timing recovery process.

FIG. 3 is an illustration of a shift register.

FIG. 4 is a graph showing an output of a phase integration portion of the circuit of FIG. 2, and a mathematical formula for using the phase integration output to compute a frequency offset value.

FIG. 5 is a signal flow diagram of the timing recovery process.

FIG. 6 is a flowchart for illustrating the steps of the timing recovery process.

DETAILED DESCRIPTION OF THE INVENTION

The present invention addresses the need for more effective timing recovery circuits to be used in high-speed channels, such as a read channel of a hard disk drive. In the development of the present invention, the inventor has recognized that a timing circuit (e.g., a phase-locked loop circuit) can be viewed as being either a type I timing circuit, in which only phase correction occurs, or a type II timing circuit, in which both phase correction and frequency correction occur. In a type I circuit, because only phase correction occurs, the frequency integration feedback loop need not be operational. Thus, in a type I circuit, a higher loop bandwidth and correspondingly higher speed are possible, as compared to a type II circuit having the same latency, because a type I circuit is inherently more stable than a type II circuit.

A type II timing circuit can be used as a type I timing circuit by disabling the frequency integration feedback loop. This may be achieved by setting the input to the frequency integration feedback loop equal to zero. In this manner, a high bandwidth type I circuit can operate to "lock" onto the correct timing phase. However, because no frequency correction occurs, there is still a significant timing frequency error. Such an uncorrected timing frequency error will eventually cause the timing circuit to fail, after the channel switches from acquisition mode to tracking mode.

The solution proposed in this invention is to use the type I circuit while in the acquisition mode, and simultaneously calculate an estimated value of frequency offset. By calculating the estimated frequency offset while in the acquisition mode, the timing frequency can be adjusted prior to exiting acquisition mode and entering tracking mode. Referring to FIG. 1, the procedure is as follows: First, during the acquisition mode period 105, operate the type I circuit at a high bandwidth value 110 to lock onto the timing phase and calculate the frequency offset. Then, enable the frequency integration feedback loop, thereby converting the circuit into a type II circuit, by resetting its input so that the input is equal to the calculated frequency offset value. Finally, reduce the bandwidth to a low value 115 so that the type II circuit can operate in tracking mode 120 while maintaining stability of the timing circuit.

The frequency offset is calculated by the type I circuit by taking two phase measurements at the output of the phase integration feedback loop, subtracting the first value from the second, and dividing the difference by the elapsed time.

Referring to FIG. 2, a preferred implementation of such a timing circuit is the use of a digital loop filter 200 in a phase-locked loop circuit (DPLL). The digital loop 200 includes two integrators 205, 210. The first integrator 205 is the timing frequency integrator, and the second integrator 210 is the timing phase integrator. The target signal $S_T$ 215, i.e., the signal being communicated via the channel and requiring timing recovery, is one input to the frequency integrator 205. The frequency correction gain parameter acts as a second input 220 to the frequency integrator 205 and is denoted by the variable b. A multiplier 225 combines the inputs $S_T$ 215 and b 220 to produce another version of the signal which has the same characteristics as $S_T$ 215, except that its magnitude is controlled by b 220. This result enters a feedback loop via an adder 230. A multiplexer 235 combines in an output of a phase shift measurement circuit 240, which is further described below. A delay element 245 operates on the result of multiplexing the magnitude-controlled signal with the phase shift measurement, and the output of the delay element 245 is fed back to the adder 230. By adding the delayed version of the magnitude-controlled signal with the undelayed version of the magnitude-controlled signal (while taking phase shift into account), an estimate of the frequency offset is made.

The output of the frequency integrator 205 is provided as one input to the phase integrator 210, and the other input represents the signal $S_T$ 215 with its magnitude multiplied using a multiplier 250 by the phase correction gain parameter, denoted by the variable a 255. The phase integrator 210 generally comprises a feedback loop, and may be viewed as being a digital voltage-controlled oscillator (VCO). The two inputs to the digital VCO 210 are added together using an adder 260, and a delay element 265 operates on this sum. The output of the digital VCO 210 is fed back additively via an adder 270 to enable the phase offset and the frequency offset to be estimated. The same output is provided as input to the phase shift measurement circuit 240. Referring also to FIG. 3, the phase shift measurement circuit 240 may be embodied in a digital shift register circuit 300.

Referring to FIGS. 2 and 4, with a frequency offset being outputted by the frequency integrator 205, the output of the phase integrator 210 will ramp linearly as a function of time, and wrap around as it overflows. The graph 405 in FIG. 4 depicts this output. The linear ramping at the output of the phase integrator provides the control signal to a phase interpolator 275 which effectively creates the frequency offset from a signal generator 280. If the frequency integrator 205 is enabled by setting the input gain b 220 to some nonzero value, the DPLL 200 is running in type II mode. However, if the phase correction gain a 255 is sufficiently large, as in the typical case during the acquisition mode period 105, the loop 200 can still function properly while the frequency integrator 205 is disabled. Such a disablement can be achieved by setting the frequency correction gain parameter b 220 equal to zero. This will allow the DPLL 200 to run in type I mode. A small residual timing phase error will occur in the DPLL system to provide the driving force to cause the phase integrator 210 to ramp. The ramp rate at the output of the phase integrator 210 is a direct measure of the frequency error. So, by measuring the phase integrator output value $\phi_0$ 410 at a certain time $t_0$ 415 during the acquisition mode period 105 and measuring the phase integrator output $\phi_1$ 420 again at another time $t_1$ 425, the frequency error $f_{offset}$ 430 can be calculated according to the equation 435: $f_{offset}=(\phi_1-\phi_0)/(t_1-t_0)$.

Once the frequency offset value 430 is calculated, the frequency integrator 205 can be enabled by setting the input frequency correction gain parameter b 220 to that value. Thus, higher stability for the timing loop 200 is achieved during acquisition 105, while effectively providing frequency correction capability that is normally provided by a type II timing circuit.

Referring to FIG. 3, one common embodiment for the phase shift measurement circuit 240 is a digital shift register circuit 300. The digital shift register circuit 300 includes an eight-bit register 305 and an adder 310. The output of the phase integrator 210 is fed into the register 305 in the form of an eight-bit word, and this output is also fed directly to the adder 310. The register 305 may shift the bits rotationally as a function of time, and the output of this rotational operation is fed to the adder 310. By adding the eight-bit word to a rotated version of itself, the phase shift measurement operation is accomplished.

Referring to FIG. 5, a signal flow for the timing recovery process is shown. The signal flows occurring within the digital loop filter 200 are shown within the dotted line. Referring also to FIG. 4, the phase integrator 210 outputs an overflow signal 510 that has a ramp profile as depicted in graph 405. The overflow signal 510 flows into the phase interpolator 275, which outputs the frequency offset 430. The frequency offset 430 then flows back into the frequency integrator 205, which adjusts the frequency 515, thereby enabling the DPLL 200 to enter the tracking mode 120.

Referring to FIG. 6, a flow chart for the entire timing recovery process 600 is shown. The first step 605 is to disable the frequency integrator 205 by zeroing the frequency correction gain parameter 220. The process 600 can be performed without actually setting the frequency correction gain parameter 220 to zero, although zeroing the parameter 220 is preferred; the important objective is that the process must remain stable while operating at a high value 110 of bandwidth for the acquisition mode 105. The next step 610 is to set the bandwidth for the acquisition mode 105 to a high value 110, thereby allowing for the rapid acquisition which is necessary to the operation of the high-speed channel. The next step 615 is to transmit the target signal $S_T$ 215 through the DPLL 200 to the phase interpolator 275. The disablement of the frequency integrator 205 allows the phase integrator 210 to output the control signal 510, whose profile is shown in graph 405. The next step 620 is for the phase interpolator 275 to use the generated signal from the synthesizer 280 to measure the phase offset. The phase offset is then used in step 625 to compute the frequency offset 430 according to equation 435. Then, in step 630, the frequency offset 430 is equated to the frequency correction gain parameter 220, thereby enabling the frequency integrator 205. This allows the frequency adjustment 515 to occur, thereby allowing the DPLL 200 to enter the tracking mode 120. The bandwidth for tracking mode is set to a low value 115 in step 635. Finally, in step 640, the DPLL 200 makes adjustments for further phase and frequency deviations while in the tracking mode 120.

Referring again to FIG. 1, the high and low bandwidth values 110 and 115 are a function of the speed of the channel and the actual latency of the DPLL 200. The ratio between the high bandwidth value 110 and the low bandwidth value 115 is application dependent. A typical ratio may be 2:1 or 3:1, although some systems may have ratios as high as 4:1 or 5:1. Latency is typically measured in clock cycles, and a high latency circuit such as the DPLL 200 may have a latency as high as 10 to 15.

One application for which the present invention may be very useful is a read channel for a hard disk drive. Every time there is an access to a sector of data within the disk drive, the signal must be reacquired. Because the capacities of disk drives are increasing, the speed and accuracy of the read channel is impacted significantly by timing recovery. Another pertinent application is a data communication system, such as a 10-Gigabyte Ethernet. Acquisition of a signal occurs each time a network device is activated or connected to the network.

Various equivalent embodiments of the present invention may be realized. For example, the described embodiments may be embodied in special purpose integrated circuits (ICs), digital signal processors (DSPs), or software recorded on a computer-readable storage medium. As another example, any type of circuitry that performs a timing recovery function for a signal by adjusting phase and frequency can take advantage of the methodology described herein; the circuit need not necessarily be a phase-locked loop. As another example, the phase shift measurement circuit need not necessarily be a digital shift register circuit; analog circuitry and analog signals can make effective use of the invention. As yet another example, the frequency correction gain parameter may be set to a nonzero value such that the circuit remains stable while operating at a high bandwidth in the acquisition mode.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A digital phase locked loop (DPLL) circuit comprising:
   a digital filter loop;
   a digital voltage-controlled oscillator (VCO) responsive to said digital filter loop; and
   a phase shift measurement circuit responsive to said digital VCO, wherein said digital filter loop selectively receives an output of said phase shift measurement circuit for frequency offset correction.

2. The DPLL circuit of claim 1, the DPLL circuit being operable in an acquisition mode at a high bandwidth rate and in a tracking mode at a low bandwidth rate.

3. The DPLL circuit of claim 2, wherein when the DPLL circuit is operating in the acquisition mode at a high bandwidth rate, an input to said digital filter loop is made equal to zero to maintain DPLL circuit stability.

4. The DPLL circuit of claim 3, wherein,
   when the input to said digital filter loop is made equal to zero, said digital VCO is configured to synchronize phase and to compute a value of frequency offset using said phase shift measurement circuit, and when the input to said digital filter loop is made equal to the computed value of frequency offset, the DPLL circuit is configured to operate in the tracking mode to synchronize frequency and to track further deviations of phase or frequency.

5. The DPLL circuit of claim 3, further comprising:
a phase interpolator; and
a synthesizer,
said synthesizer being operable to generate a control signal; and
said phase interpolator being configured to receive an output signal of the phase shift measurement circuit and the generated control signal and use the received signals to calculate a frequency offset value.

6. The DPLL circuit of claim 1, wherein during a first synchronization period, the DPLL circuit is configured to disable said digital filter loop and to use said digital VCO and said phase shift measurement circuit to synchronize phase and calculate a frequency offset value, and
during a second synchronization period, the DPLL circuit is configured to enable said digital filter loop and to use the calculated frequency offset value as an input to said digital filter loop to synchronize frequency.

7. The DPLL circuit of claim 6, further comprising a phase interpolator for calculating the frequency offset value using a residual phase error that remains after phase is synchronized.

8. The DPLL circuit of claim 7, wherein said phase interpolator is configured to calculate the frequency offset value by measuring phase twice, subtracting the first measured value of phase from the second measured value of phase, and dividing a result of the subtracting by an elapsed time between the two measurements.

9. The DPLL circuit of claim 1, wherein the phase shift measurement circuit comprises a shift register.

10. A read channel for a hard disk drive, the read channel including a digital phase locked loop (DPLL) circuit, the DPLL circuit comprising:
a digital filter loop;
a digital voltage-controlled oscillator (VCO) responsive to said digital filter loop; and
a phase shift measurement circuit responsive to said digital VCO, wherein said digital filter loop selectively receives an output of said phase shift measurement circuit for frequency offset correction.

11. The read channel of claim 10, the DPLL circuit being operable in an acquisition mode at a high bandwidth rate and in a tracking mode at a low bandwidth rate.

12. The read channel of claim 11, wherein when the DPLL circuit is operating in the acquisition mode at a high bandwidth rate, an input to said digital filter loop is made equal to zero to maintain DPLL circuit stability.

13. The read channel of claim 12, wherein,
when the input to said digital filter loop is made equal to zero, said digital VCO is configured to synchronize phase and to compute a value of frequency offset using said phase shift measurement circuit, and
when the input to said digital filter loop is made equal to the computed value of frequency offset, the DPLL circuit is configured to operate in the tracking mode to synchronize frequency and to track further deviations of phase or frequency.

14. The read channel of claim 12, the DPLL circuit further comprising:
a phase interpolator; and
a synthesizer,
said synthesizer being operable to generate a control signal; and
said phase interpolator being configured to receive an output signal of the phase shift measurement circuit and the generated control signal and use the received signals to calculate a frequency offset value.

15. The read channel of claim 10, wherein during a first synchronization period, the DPLL circuit is configured to disable said digital filter loop and to use said digital VCO and said phase shift measurement circuit to synchronize phase and calculate a frequency offset value, and
during a second synchronization period, the DPLL circuit is configured to enable said digital filter loop and to use the calculated frequency offset value as an input to said digital filter loop to synchronize frequency.

16. The read channel of claim 15, the DPLL circuit further comprising a phase interpolator for calculating the frequency offset value using a residual phase error that remains after phase is synchronized.

17. The read channel of claim 16, wherein said phase interpolator is configured to calculate the frequency offset value by measuring phase twice, subtracting the first measured value of phase from the second measured value of phase, and dividing a result of the subtracting by an elapsed time between the two measurements.

18. The read channel of claim 10, wherein the phase shift measurement circuit comprises a shift register.

19. A digital data acquisition loop, used with a phase interpolator, comprising:
a phase timing circuit having an overflow output including a control signal, the control signal being provided to the phase interpolator which outputs a frequency offset corresponding to the overflow output; and
a frequency timing circuit for receiving the frequency offset from the phase interpolator and adjusting a frequency timing of an input data stream based on the received frequency offset.

20. The digital data acquisition loop of claim 19, the loop being configured to initially disable the frequency timing circuit during an acquisition period corresponding to the outputting of the frequency offset, and to enable the frequency timing circuit during a tracking period that follows the outputting of the frequency offset.

21. The digital data acquisition loop of claim 20, wherein the loop is configured to operate at a high speed during the acquisition period, and wherein the loop is configured to operate at a low speed during the tracking period.

22. An in tegrated circuit, comprising:
a frequency synchronization feedback loop;
a phase synchronization feedback loop responsive to said frequency synchronization feedback loop; and
a phase shift measurement circuit responsive to said phase synchronization feedback loop, wherein said frequency synchronization feedback loop selectively receives an output of said phase shift measurement circuit for frequency offset correction.

23. The integrated circuit of claim 22, wherein, when an input to said frequency synchronization feedback loop is made equal to zero, said phase synchronization feedback loop is operable at a high bandwidth rate to synchronize phase and to compute a value of frequency offset using said phase shift measurement circuit; and when the input to said frequency synchronization feedback loop is made equal to the computed value of frequency offset, said frequency synchronization feedback loop and said phase synchronization feedback loop are jointly operable at a low bandwidth rate to synchronize frequency and to track further deviations of phase or frequency.

24. A digital phase locked loop (DPLL) circuit, comprising:

a timing frequency integrator portion including a first multiplier component, a first adder component, a multiplexer, and a first delay component connected in series, said first delay component being configured to provide an output as feedback to said first adder component;

a timing phase integrator portion including a second multiplier component, a second adder component, a third adder component, and a second delay component connected in series, said second delay component being configured to provide an output as feedback to said third adder component;

a phase shift measurement portion which is configured to provide an output to the multiplexer of the timing frequency integrator portion;

a phase interpolator; and a signal generator, said timing frequency integrator portion, said timing phase integrator portion, and said phase interpolator being connected in series;

said phase shift measurement portion and said phase interpolator being connected in series;

said signal generator being operable to generate a signal and provide the generated signal as an input to said phase interpolator, and wherein, when an input to said timing frequency integrator portion is made equal to zero, said timing phase integrator portion is operable at a high bandwidth rate to synchronize phase and to compute a value of frequency offset using said phase interpolator, and when the input to said timing frequency integrator portion is made equal to the computed value of frequency offset, said timing frequency integrator portion and said timing phase integrator portion are jointly operable at a low bandwidth rate to synchronize frequency and to track further deviations of phase or frequency.

25. The DPLL circuit of claim 24, wherein said phase shift measurement portion comprises a shift register.

26. A DPLL apparatus for controlling frequency and phase in a high-speed control circuit, the apparatus comprising:

means for synchronizing frequency using a first type of feedback loop;

means for synchronizing phase using a second type of feedback loop, said phase synchronizing means being responsive to said frequency synchronizing means; and means for measuring phase shift, said phase shift measuring means being responsive to said phase synchronizing means, wherein said frequency synchronizing means selectively receives an output of said phase shift measuring means for frequency offset correction.

27. The DPLL apparatus of claim 26, the apparatus being operable in an acquisition mode at a high bandwidth rate and in a tracking mode at a low bandwidth rate.

28. The DPLL apparatus of claim 27, wherein when the apparatus is operating in the acquisition mode at a high bandwidth rate, an input to said frequency synchronizing means is made equal to zero to maintain stability of the apparatus.

29. The DPLL apparatus of claim 28, wherein, when the input to said frequency synchronizing means is made equal to zero, said phase synchronizing means is configured to synchronize phase and to compute a value of frequency offset using said phase shift measuring means, and when the input to said frequency synchronizing means is made equal to the computed value of frequency offset, the apparatus is configured to operate in the tracking mode to synchronize frequency and to track further deviations of phase or frequency.

30. The DPLL apparatus of claim 28, further comprising:

means for interpolating phase; and means for generating a control signal, said phase interpolating means being configured to receive an output signal from said phase shift measuring means and a control signal from said control signal generating means and to use the received signals to calculate a frequency offset value.

31. The DPLL apparatus of claim 26, wherein during a first synchronization period, the apparatus is configured to disable said frequency synchronizing means and to use said phase synchronizing means and said phase shift measuring means to synchronize phase and calculate a frequency offset value, and during a second synchronization period, the apparatus is configured to enable said frequency synchronizing means and to use the calculated frequency offset value as an input to said frequency synchronizing means to synchronize frequency.

32. The DPLL apparatus of claim 31, further comprising means for interpolating phase, said phase interpolating means being configured to calculate the frequency offset value using a residual phase error that remains after phase is synchronized.

33. The DPLL apparatus of claim 32, wherein said phase interpolating means is configured to calculate the frequency offset value by measuring phase twice, subtracting the first measured value of phase from the second measured value of phase, and dividing a result of the subtracting by an elapsed time between t he two measurements.

34. The DPLL apparatus of claim 26, wherein the phase shift measuring means comprises means for performing shift register operations.

35. A read channel apparatus for accessing information stored in a hard disk drive, the read channel apparatus including a DPLL apparatus for controlling frequency and phase in a high-speed control circuit, the DPLL apparatus comprising:

means for synchronizing frequency using a first type of feedback loop;

means for synchronizing phase using a second type of feedback loop, said phase synchronizing means being responsive to said frequency synchronzing means; and means for measuring phase shift, said phase shift measuring means being responsive to said phase synchronizing means, wherein said frequency synchronizing means selectively receives an output of said phase shift measuring means for frequency offset correction.

36. The read channel apparatus of claim 35, the DPLL apparatus being operable in an acquisition mode at a high bandwidth rate and in a tracking mode at a low bandwidth rate.

37. The read channel apparatus of claim 36, wherein when the DPLL apparatus is operating in the acquisition mode at a high bandwidth rate, an input to said frequency synchronizing means is made equal to zero to maintain stability of the DPLL apparatus.

38. The read channel apparatus of claim 37, wherein,
when the input to said frequency synchronizing means is made equal to zero, said phase synchronizing means is configured to synchronize phase and to compute a value of frequency offset using said phase shift measuring means, and
when the input to said frequency synchronizing means is made equal to the computed value of frequency offset, the DPLL apparatus is configured to operate in the tracking mode to synchronize frequency and to track further deviations of phase or frequency.

39. The read channel apparatus of claim 37, the DPLL apparatus further comprising:
means for interpolating phase; and
means for generating a control signal,
said phase interpolating means being configured to receive an output signal from said phase shift measuring means and a control signal from said control signal generating means and to use the received signals to calculate a frequency offset value.

40. The read channel apparatus of claim 35, wherein during a first synchronization period, the DPLL apparatus is configured to disable said frequency synchronizing means and to use said phase synchronizing means and said phase shift measuring means to synchronize phase and calculate a frequency offset value, and
during a second synchronization period, the DPLL apparatus is configured to enable said frequency synchronizing means and to use the calculated frequency offset value as an input to said frequency synchronizing means to synchronize frequency.

41. The read channel apparatus of claim 40, the DPLL apparatus further comprising means for interpolating phase, said phase interpolating means being configured to calculate the frequency offset value using a residual phase error that remains after phase is synchronized.

42. The read channel apparatus of claim 41, wherein said phase interpolating means is configured to calculate the frequency offset value by measuring phase twice, subtracting the first measured value of phase from the second measured value of phase, and dividing a result of the subtracting by an elapsed time between the two measurements.

43. The read channel apparatus of claim 35, wherein the phase shift measuring means comprises means for performing shift register operations.

44. An apparatus for phase and frequency adjusting an input digital data stream, comprising:
means for integrating a phase of the input data stream until an overflow causes a control signal to be output;
means for determining a frequency offset from the control signal; and
means for integrating a frequency of the input data stream using the determined frequency offset.

45. The apparatus of claim 44, the apparatus being configured to initially disable the frequency integrating means during an acquisition period corresponding to the phase integrating and the determining of the frequency offset, and to enable the frequency integrating means during a tracking period that follows the determining of the frequency offset.

46. The apparatus of claim 45, wherein the apparatus is configured to operate at a high speed during the acquisition period, and at a low speed during the tracking period.

47. An integrated circuit apparatus for timing recovery in a high-speed control circuit, the apparatus comprising:
means for synchronizing frequency using a first type of feedback loop;
means for synchronizing phase using a second type of feedback loop, said phase synchronizing means being responsive to said frequency synchronizing means; and
means for measuring phase shift, said phase shift measuring means being responsive to said phase synchronizing means, wherein said frequency synchronizing means selectively receives an output of said phase shift measuring means for frequency offset correction.

48. The integrated circuit apparatus of claim 47, wherein,
when an input to said frequency synchronizing means is made equal to zero, said phase synchronizing means is operable at a high bandwidth rate to synchronize phase and to compute a value of frequency offset using said phase shift measuring means; and
when the input to said frequency synchronizing means is made equal to the computed value of frequency offset, the integrated circuit apparatus is operable at a low bandwidth rate to synchronize frequency and to track further deviations of phase or frequency.

49. An apparatus for controlling frequency and phase in a high-speed control circuit, the apparatus comprising:
means for performing timing frequency integration including a first means for multiplying, a first means for adding, a means for multiplexing, and a first means for delay connected in series, said first delay means being configured to provide an output as feedback to said first adding means;
means for performing timing phase integration including a second means for multiplying, a second means for adding, a third means for adding, and a second means for delay connected in series, said second delay means being configured to provide an output as feedback to said third adding means;
means for measuring phase shift which is configured to provide an output to the multiplexing means of the timing frequency integration means;
means for interpolating phase; and
means for generating a signal,
said timing frequency integration means, said timing phase integration means, and said phase interpolating means being connected in series;
said phase shift measuring means and said phase interpolating means being connected in series;
said signal generating means being operable to generate a signal and provide the generated signal as an input to said phase interpolating means, and
wherein, when an input to said timing frequency integration means is made equal to zero, said timing phase integration means is operable at a high bandwidth rate to synchronize phase and to compute a value of frequency offset using said phase interpolating means, and
when the input to said timing frequency integration means is made equal to the computed value of frequency offset, said timing frequency integration means and said timing phase integration means are jointly operable at a low bandwidth rate to synchronize frequency and to track further deviations of phase or frequency.

50. The apparatus of claim 49, wherein said phase shift measuring means comprises a means for performing shift register operations.

51. A method of controlling frequency and phase in a high-speed control circuit, the circuit including a first loop that generates a first type of feedback and a second loop that generates a second type of feedback, the method comprising the steps of:

synchronizing frequency using the first type of feedback;

synchronizing phase using the second type of feedback, said phase synchronizing step being responsive to said frequency synchronizing step; and measuring phase shift, said phase shift measuring step being responsive to said phase synchronizing step, wherein said frequency synchronizing step selectively uses a result of said phase shift measuring step for frequency offset correction.

52. The method of claim 51, the method being executable in an acquisition mode at a high bandwidth rate and in a tracking mode at a low bandwidth rate.

53. The method of claim 52, wherein when the method is executing in the acquisition mode at a high bandwidth rate, an input to said frequency synchronizing step is made equal to zero.

54. The method of claim 53, further comprising the steps of:

when the input to said frequency synchronizing step is made equal to zero, computing a value of frequency offset; and when the input to said frequency synchronizing step is made equal to the computed value of frequency offset, tracking further deviations of phase or frequency.

55. The method of claim 53, further comprising the steps of:

receiving an output signal resulting from said phase shift measuring step;

generating a control signal; and using the received output signal and the generated control signal to calculate a frequency offset value.

56. The method of claim 51, wherein during a first synchronization period, said frequency synchronizing step is bypassed and said phase synchronizing step and said phase shift measuring step are executed to synchronize phase and calculate a frequency offset value, and during a second synchronization period, said frequency synchronizing step is executed by using the calculated frequency offset value as an input.

57. The method of claim 56, further comprising the step of calculating the frequency offset value using a residual phase error resulting from said phase synchronizing step.

58. The method of claim 57, wherein the step of calculating the frequency offset value comprises:

measuring phase twice;

subtracting the first measured value of phase from the second measured value of phase; and dividing a result of the subtracting by an elapsed time between the two measurements.

59. The method of claim 51, wherein the phase shift measuring step comprises performing shift register operations.

60. A reading method of accessing information stored in a hard disk drive, the reading method including a timing recovery method of controlling frequency and phase in a high-speed control circuit, the circuit including a first loop that generates a first type of feedback and a second loop that generates a second type of feedback, the timing recovery method comprising the steps of:

synchronizing frequency using the first type of feedback;

synchronizing phase using the second type of feedback, said phase synchronizing step being responsive to said frequency synchronizing step; and measuring phase shift, said phase shift measuring step being responsive to said phase synchronizing step, wherein said frequency synchronizing step selectively uses a result of said phase shift measuring step for frequency offset correction.

61. The reading method of claim 60, the timing recovery method being executable in an acquisition mode at a high bandwidth rate and in a tracking mode at a low bandwidth rate.

62. The reading method of claim 61, wherein when the timing recovery method is executing in the acquisition mode at a high bandwidth rate, an input to said frequency synchronizing step is made equal to zero.

63. The reading method of claim 62, the timing recovery method further comprising the steps of:

when the input to said frequency synchronizing step is made equal to zero, computing a value of frequency offset; and when the input to said frequency synchronizing step is made equal to the computed value of frequency offset, tracking further deviations of phase or frequency.

64. The reading method of claim 62, the timing recovery method further comprising the steps of:

receiving an output signal resulting from said phase shift measuring step;

generating a control signal; and using the received output signal and the generated control signal to calculate a frequency offset value.

65. The reading method of claim 60, wherein during a first synchronization period, said frequency synchronizing step is bypassed and said phase synchronizing step and said phase shift measuring step are executed to synchronize phase and calculate a frequency offset value, and during a second synchronization period, said frequency synchronizing step is executed by using the calculated frequency offset value as an input.

66. The reading method of claim 65, the timing recovery method further comprising the step of calculating the frequency offset value using a residual phase error resulting from said phase synchronizing step.

67. The reading method of claim 66, wherein the step of calculating the frequency offset value comprises:

measuring phase twice;

subtracting the first measured value of phase from the second measured value of phase; and dividing a result of the subtracting by an elapsed time between the two measurements.

68. The reading method of claim 60, wherein the phase shift measuring step comprises performing shift register operations.

69. A method of phase and frequency adjusting an input digital data stream, comprising the steps of:

integrating a phase of the input data stream until an overflow causes a control signal to be output;

determining a frequency offset from the control signal; and integrating a frequency of the input data stream using the determined frequency offset.

70. The method of claim 69, wherein during an acquisition period, said frequency integrating step is bypassed, and during a tracking period that follows said step of determining the frequency offset, said frequency integrating step is executed.

71. The method of claim 70, wherein during the acquisition period, the method executes at a high speed, and during the tracking period, the method executes at a low speed.

72. An integrating method of combining signal processing functions, the integrating method including a timing recovery method of controlling frequency and phase in a high-speed control circuit, the circuit including a first loop that generates a first type of feedback and a second loop that generates a second type of feedback, the timing recovery method comprising the steps of:

synchronizing frequency using the first type of feedback;

synchronizing phase using the second type of feedback, said phase synchronizing step being responsive to said frequency synchronizing step; and measuring phase shift, said phase shift measuring step being responsive to said phase synchronizing step, wherein said frequency synchronizing step selectively uses a result of said phase shift measuring step for frequency offset correction.

73. The integrating method of claim 72, the timing recovery method further comprising the steps of:

when an input to said frequency synchronizing step is made equal to zero, computing a value of frequency offset; and when the input to said frequency synchronizing step is made equal to the computed value of frequency offset, tracking further deviations of phase or frequency.

74. A method of controlling frequency and phase in a high-speed control circuit, the method comprising the steps of:

performing timing frequency integration, including a first step of multiplying, a first step of adding, a step of multiplexing, and a first step of delaying, a result of said first delaying step being provided as feedback input to said first adding step;

performing timing phase integration, including a second step of multiplying, a second step of adding, a third step of adding, and a second step of delaying, a result of said second delaying step being provided as feedback input to said third adding step;

measuring phase shift;

providing a result of said phase shift measuring step as input to said multiplexing step within said timing frequency integration performing step;

generating a control signal; and interpolating phase using results of said timing phase integration performing step, said phase shift measuring step, and said control signal generating step, wherein, when an input to said timing frequency integration performing step is made equal to zero, said timing phase integration performing step and said phase interpolating step are executable at a high bandwidth rate to synchronize phase and to compute a value of frequency offset, and when the input to said timing frequency integration performing step is made equal to the computed value of frequency offset, said timing frequency integration performing step and said timing phase integration performing step are jointly executable at a low bandwidth rate to synchronize frequency and to track further deviations of phase or frequency.

75. The method of claim 74, wherein said phase shift measuring step comprises performing shift register operations.

76. A storage medium for storing software for controlling frequency and phase in a high-speed control circuit, the circuit including a first loop that generates a first type of feedback and a second loop that generates a second type of feedback, and the software being computer-readable, wherein the software includes instructions for causing a computer to:

synchronize frequency using the first type of feedback;

synchronize phase using the second type of feedback, said phase synchronization being responsive to said frequency synchronization; and measure phase shift, said phase shift measurement being responsive to said phase synchronization, wherein said frequency synchronization selectively uses a result of said phase shift measurement for frequency offset correction.

77. The storage medium of claim 76, the instructions being executable in an acquisition mode at a high bandwidth rate and in a tracking mode at a low bandwidth rate.

78. The storage medium of claim 77, wherein when the instructions are being executed in the acquisition mode at a high bandwidth rate, an input to said frequency synchronization is made equal to zero.

79. The storage medium of claim 78, the software further including instructions for causing the computer to:

when the input to said frequency synchronization is made equal to zero, compute a value of frequency offset; and when the input to said frequency synchronization is made equal to the computed value of frequency offset, track further deviations of phase or frequency.

80. The storage medium of claim 78, the software further including instructions for causing the computer to:

receive an output signal resulting from said phase shift measurement;

generate a control signal; and use the received output signal and the generated control signal to calculate a frequency offset value.

81. The storage medium of claim 76, wherein during a first synchronization period, the instructions corresponding to said frequency synchronization are bypassed and the instructions corresponding to said phase synchronization and said phase shift measurement are executed to synchronize phase and calculate a frequency offset value, and during a second synchronization period, the instructions corresponding to said frequency synchronization are executed by using the calculated frequency offset value as an input.

82. The storage medium of claim 81, the software further including instructions for causing the computer to calculate the frequency offset value using a residual phase error resulting from said phase synchronization.

83. The storage medium of claim 82, wherein the instructions for causing the computer to calculate the frequency offset value include instructions for causing the computer to:

measure phase twice;

subtract the first measured value of phase from the second measured value of phase; and divide a result of the subtracting by an elapsed time between the two measurements.

84. The storage medium of claim 76, wherein the instructions for causing the computer to measure phase shift include instructions for causing the computer to simulate shift register operations.

85. A storage medium for storing reading software for accessing information stored in a hard disk drive, the reading software being computer-readable and including timing recovery software for controlling frequency and phase in a high-speed control circuit, the circuit including a first loop that generates a first type of feedback and a second loop that generates a second type of feedback, wherein the timing recovery software includes instructions for causing a computer to:

synchronize frequency using the first type of feedback;

synchronize phase using the second type of feedback, said phase synchronization being responsive to said frequency synchronization; and measure phase shift, said phase shift measurement being responsive to said phase synchronization, wherein said frequency synchronization selectively uses a result of said phase shift measurement for frequency offset correction.

86. The storage medium of claim 85, the instructions being executable in an acquisition mode at a high bandwidth rate and in a tracking mode at a low bandwidth rate.

87. The storage medium of claim 86, wherein when the instructions are being executed in the acquisition mode at a high bandwidth rate, an input to said frequency synchronization is made equal to zero.

88. The storage medium of claim 87, the timing recovery software further including instructions for causing the computer to:

when the input to said frequency synchronization is made equal to zero, compute a value of frequency offset; and when the input to said frequency synchronization is made equal to the computed value of frequency offset, track further deviations of phase or frequency.

89. The storage medium of claim 87, the timing recovery software further including instructions for causing the computer to:

receive an output signal resulting from said phase shift measurement;

generate a control signal; and use the received output signal and the generated control signal to calculate a frequency offset value.

90. The storage medium of claim 85, wherein during a first synchronization period, the instructions corresponding to said frequency synchronization are bypassed and the instructions corresponding to said phase synchronization and said phase shift measurement are executed to synchronize phase and calculate a frequency offset value, and during a second synchronization period, the instructions corresponding to said frequency synchronization are executed by using the calculated frequency offset value as an input.

91. The storage medium of claim 90, the timing recovery software further including instructions for causing the computer to calculate the frequency offset value using a residual phase error resulting from said phase synchronization.

92. The storage medium of claim 91, wherein the instructions for causing the computer to calculate the frequency offset value include instructions for causing the computer to:

measure phase twice;

subtract the first measured value of phase from the second measured value of phase; and divide a result of the subtracting by an elapsed time between the two measurements.

93. The storage medium of claim 85, wherein the instructions for causing the computer to measure phase shift include instructions for causing the computer to simulate shift register operations.

94. A storage medium for storing software for phase and frequency adjusting an input digital data stream, the software being computer-readable, wherein the software includes instructions for causing a computer to:

integrate a phase of the input data stream until an overflow causes a control signal to be output;

determine a frequency offset from the control signal; and integrate a frequency of the input data stream using the determined frequency offset.

95. The storage medium of claim 94, wherein during an acquisition period, the instructions corresponding to integrating a frequency are bypassed and the instructions corresponding to integrating a phase and determining a frequency offset are executed, and during a tracking period that follows the acquisition period, the instructions corresponding to integrating a frequency, integrating a phase, and determining a frequency offset are executed.

96. The storage medium of claim 95, wherein during the acquisition period, the instructions are executed at a high speed, and during the tracking period, the instructions are executed at a low speed.

97. A storage medium for storing integrating software for combining signal processing functions, the integrating software being computer-readable and including timing recovery software for controlling frequency and phase in a high-speed control circuit, the circuit including a first loop that generates a first type of feedback and a second loop that generates a second type of feedback, wherein the timing recovery software includes instructions for causing a computer to:

synchronize frequency using the first type of feedback;

synchronize phase using the second type of feedback, said phase synchronization being responsive to said frequency synchronization; and measure phase shift, said phase shift measurement being responsive to said phase synchronization, wherein said frequency synchronization selectively uses a result of said phase shift measurement for frequency offset correction.

98. The storage medium of claim 97, the timing recovery software further including instructions for causing the computer to:

when an input to said frequency synchronization is made equal to zero, compute a value of frequency offset; and when the input to said frequency synchronization is made equal to the computed value of frequency offset, track further deviations of phase or frequency.

99. A storage medium for storing software for controlling frequency and phase in a high-speed control circuit, the software being computer-readable, wherein the software includes instructions for causing a computer to:

perform timing frequency integration, including a first multiplication, a first addition, a multiplexing, and a first delay, a result of said first delay being provided as feedback input to said first addition;

perform timing phase integration, including a second multiplication, a second addition, a third addition, and a second delay, a result of said second delay being provided as feedback input to said third addition;

measure phase shift;

provide a result of said phase shift measurement as input to said multiplexing within said timing frequency integration performance;

generate a control signal; and interpolate phase using results of said timing phase integration performance, said phase shift measurement, and said control signal generation, wherein, when an input to said timing frequency integration performance is made equal to zero, instructions corresponding to said timing phase integration performance and said phase interpolation are executable at a high bandwidth rate to synchronize phase and to compute a value of frequency offset, and when the input to said timing frequency integration performance is made equal to the computed value of frequency offset, instructions corresponding to said timing frequency integration performance and said timing phase integration performance are jointly executable at a low bandwidth rate to synchronize frequency and to track further deviations of phase or frequency.

100. The storage medium of claim 99, wherein the instructions for causing the computer to measure phase shift include instructions for causing the computer to simulate shift register operations.

* * * * *